United States Patent [19]

Hoeher et al.

[11] Patent Number: 5,457,704
[45] Date of Patent: Oct. 10, 1995

[54] POST PROCESSING METHOD AND APPARATUS FOR SYMBOL RELIABILITY GENERATION

[75] Inventors: Peter Hoeher, Herrsching, Germany; Nambirajan Seshadri, Chatham, N.J.

[73] Assignee: AT&T IPM Corp., Coral Gables, Fla.

[21] Appl. No.: 65,296

[22] Filed: May 21, 1993

[51] Int. Cl.$^6$ ............................ G06F 11/10; H03M 13/12
[52] U.S. Cl. ................................................................ 371/43
[58] Field of Search .................................. 371/43, 44, 45; 341/94, 107

[56] References Cited

U.S. PATENT DOCUMENTS

| | | | |
|---|---|---|---|
| 5,228,061 | 7/1993 | Newby et al. | 371/43 |
| 5,230,003 | 7/1993 | Dent et al. | 371/43 |
| 5,295,142 | 3/1994 | Hatakeyama | 371/43 |

OTHER PUBLICATIONS

L. R. Bahl et al., "Optical Decoding of Linear Codes for Minimizing Symbol Error Rate", *IEEE Transactions on Information Theory*, 284–287 (Mar. 1974).

S. Verdu, "Minimum Probability of Error for Asynchronous Gaussian Multiple–Access Channels", vol. IT–32,85–96, No. 1, 85–96 (Jan. 1986).

J. Hagenauer et al., "A Viterbi Algorithm with Soft–Decision Outputs and its Applications", *Proc. GLOBECOM '89*, Dallas, Tex., 1680–1686 (Nov. 1989).

R. Sfez et al., "A Weighted–Output Variant of the Viterbi Algorithm for Concatenated Schemes Using A Convolutional Inner Code", *Proc. EUROCODE '90*, Udine, Italy, (13 pages), (Nov. 1990).

T. Aulin, "A Fractional Viterbi–Type Trellis Decoding Algorthm", Abstracts of the IEEE Int. Symp. Inf. Theory, Ann Arbor, Mich. (Oct. 1989), (abstract only).

G. Battail, "Weighting the Symbols Decoded by the Viterbi Algorithm", Abstracts of the IEEE Int. Symp. Inf. Theory, Ann Arbor, Mich. (Oct. 1989), (abstract only).

J. Huber et al., "Reliability Estimation for Symbols Detected by Trellis–Decoders", *AEU*, vol. 44, 8–21 (English abstract only) (Jan. 1990).

N. Seshadri et al., "Generalized Viterbi Algorithms for Error Detection with Convolutional Codes", *Proc. GLOBECOMM '89*, Dallas, Tex., 1534–1538 (Nov. 1989).

T. Hashimoto, "A List–Type Reduced–Constraint Generalization of the Viterbi Algorithm", *IEEE Transactions of Information Theory*, vol.–IT, No. 6, 866–876 (Nov. 1987).

G. D. Forney, Jr., "The Viterbi Algorithm", *Proceedings of the IEEE*, vol. 61, No. 3, 268–278 (Mar. 1973).

O. Jorgensen et al., "High Speed VLSI Architectures for Soft Output Viterbi Decoding", *1991 Proceedings International Conference on Application Specific Array Processors*, Berkeley, Calif. (Aug. 1992).

*Primary Examiner*—Roy N. Envall, Jr.
*Assistant Examiner*—Emmanuel L. Moise
*Attorney, Agent, or Firm*—Katharyn E. Olson

[57] ABSTRACT

A method for a post-processors provides reliability information about every decoded data symbol at the output of an arbitrary decoder. This reliability information is generated by comparing the decoded sequence to a small list of alternative sequences which differ from the decoded sequence at least in the symbol for which the reliability is being evaluated. It is shown that this algorithm is a simplification of the optimal symbol-by-symbol detector (OSSD).

6 Claims, 2 Drawing Sheets

POST PROCESSING METHOD AND APPARATUS FOR SYMBOL RELIABILITY GENERATION

TECHNICAL FIELD

This invention is a method and apparatus for post-processoring to provide reliability information for decoded data symbols at the output of a decoder.

BACKGROUND OF THE INVENTION

The Viterbi algorithm (VA) is well known as an efficient maximum likelihood (ML) sequence estimator of data encoded by a finite state machine and corrupted by white noise. See, G. D. Forney Jr., "The Viterbi Algorithm," *Proc. IEEE*, vol. 61, no. 3, pp. 268–278, Mar. 1973. In many applications, the output of the Viterbi decoder is further processed by a second decoder in a concatenated coding system. FIG. 1 shows a concatenated coding system in which outer encoder 121 transforms an information sequence a(k) into sequence b(k). Inner encoder 123 further encodes sequence b(k) to produce a sequence to be transmitted. Inner decoder 125 decodes the received sequence r(k) to produce an estimate b̂(k) of the sequence encoded by inner encoder 123. Outer decoder 127 then uses b̂(k) to generate an estimate â(k) of the information sequence. Table 1 lists four examples of specific coder combinations typical for the concatenated system of FIG. 1. In all of these, the optimal decoder should operate on the joint state space of the outer and the inner code to obtain an estimate of the information sequence. However, in the first coding combination, i.e. the combined speech and channel coding scheme, of Table 1, it is not yet known how to describe such a decoder. In the other three cases, such a decoder may be too complex to implement especially when powerful codes are used for inner and outer codes. Hence a practical approach is to first perform the decoding of the received data by the inner decoder followed by outer decoding.

TABLE 1

| Outer Encoder | Inner Encoder | Inner Decoder | Outer Decoder |
| --- | --- | --- | --- |
| 1. Speech Encoder | Convolutional Encoder | Viterbi Decoder | Speech Decoder |
| 2. Error Detection Encoder | Convolutional Encoder | Viterbi Decoder | Syndrome Decoder |
| 3. Convolutional Encoder | ISI Channel Channel | Viterbi Equalizer | Viterbi Decoder |
| 4. Reed-Solomon Encoder | Convolutional Encoder | Viterbi Decoder | Errors and Erasures Decoder |

Typically, the inner decoder produces burst errors. If the outer code is a random error correcting code, then an interleaver/deinterleaver pair 222,226 as illustrated in FIG. 2 may be inserted in the coding system of FIG. 1. The pair will help to pseudo-randomize the burst of errors so as to facilitate the outer decoding process. If the outer code/interleaver/inner code combination is thought of as a new code, then its optimal decoder, which requires exhaustive search, is even more difficult to implement.

Several techniques have been developed to improve the performance of concatenated coding systems. One such technique is the generalized Viterbi algorithm (GVA). See T. Hashimoto, "A List-Type Reduced-Constraint Generalization of the Viterbi Algorithm," *IEEE Trans. Inf. Theory*, IT-33, pp. 866–876, Nov. 1987; N. Seshadri and C-E. W. Sundberg, "Generalized Viterbi Algorithms for Error Detection With Convolutional Codes," in *Proc. GLOBECOM'89*, Dallas, Tex., pp. 1534–1538, Nov. 1989. The GVA generates a list of the L>1 best estimates (also called candidate sequences) of b̂(k) at the inner decoder output according to a metric that describes the inner channel. Each of these candidate sequences is decoded by the outer decoder according to a metric that best describes the outer channel. The best of the L decoded candidate sequences is selected as the final estimate of the information sequence. For example, in a combined speech and channel coding system of Table 1, the metric for decoding the outer code may make use of speech based properties such as pitch information, spectral information, and inter-frame correlation in order to select the of the L candidate sequences from the inner decoder. In the second case in Table 1, the outer decoder chooses the candidate with zero syndrome from the L best candidate sequences that are released by the inner decoder. See Seshadri and Sundberg, supra.

Alternatively, soft (symbol)-output Viterbi algorithms (SOVAs) have been proposed to replace the VA at the inner decoding stage. See G. Battail, "Weighting the Symbols Decoded by the Viterbi Algorithm," *Abstracts of the IEEE Int. Symp. Inf. Theory*, Ann Arbor, Mich., p. 141, Oct. 1986; J. Hagenauer and P. Hoeher, "A Viterbi Algorithm With Soft-Decision Outputs and its Applications," *Proc. GLOBECOM'89*, Dallas, Tex., pp. 1680–1686, Nov. 1989; J. Huber and Rueppel, "Reliability-Estimation for Symbols Detected by Trellis-Decoders," (in German), AEU, vol. 44, pp. 8–21, Jan. 1990. In the SOVA, the inner decoder releases the best path estimate at the output of the inner decoder along with the reliability information about each symbol in the sequence decoded by the inner decoder. The outer decoder then uses the reliability information in soft-decoding the output sequence of the inner decoder. Maximum a posteriori symbol-by-symbol detection techniques (also known as optimal symbol-by-symbol detection techniques) can also be used. However, their complexity is much higher than soft-output Viterbi algorithms.

The soft-output techniques for post-decision reliability generation suffer from shortcomings. First, the best data sequence clearly passes through only one state in the Viterbi decoding trellis at every time instant, and these decisions are available with a certain delay. Hence, if one introduces a delay in computing the soft-outputs, then the decoded symbols are available and the reliability needs to be computed only for those symbols. However, the SOVA evaluates a reliability value at the same time as the data is being decoded and thus has to compute a reliability value for each state at each time. "Two step algorithms" are more computationally efficient, but their drawback is the amount of memory required—typically, about 50% of the area of an integrated circuit designed to implement the method is consumed by the additional delay units needed to store metric differences. See J. Hagenauer, P. Hoeher, and J. Huber, "Soft-Output Viterbi and Symbol-by-Symbol MAP Decoding: Algorithms and Applications," submitted to *IEEE Trans. Comm.*; O. Jorgensen, M. Vaupel, and H. Meyr, "High-Speed VLSI Architectures for Soft-Output Viterbi Decoding," *Proc. Int. Conf. Appl. Specific Array Processors* (ASAP'92), Berkeley, Aug. 1992. Second, whenever the inner decoder makes an error the errored sequence is likely to be from a small subset of all possible data sequences especially at moderate and high signal-to-noise ratios. Prior approaches make no use of this property to reduce the complexity. See G. Battail, supra; J. Hagenauer and P. Hoeher, supra; J. Huber and Rueppel, supra; J. Hagenauer, P. Hoeher, and J. Huber, supra; and O. Jorgensen, M. Vaupel, and H. Meyr, supra.

Additionally, Sfez and Battail have proposed a method which computes the ML path and the best path among alternatives in "A Weighted-Output Variant of the Viterbi Algorithm for Concatenated Schemes Using a Convolutional Inner Code," *Proc. EUROCODE'90*, Udine, Italy, Nov. 1990. However, this method has several disadvantages: (i) computational efforts grow exponentially with the memory in the inner coding process, which implies more complexity and memory for implementation; (ii) the technique is based on event length rather than properties of the code; and (iii) the technique is restricted to Viterbi decoding. Thus, there is a need for a method and apparatus for post-processing to provide reliability information about decoded data symbols at the output of decoders that are efficient and that may be extended beyond Viterbi decoding.

SUMMARY OF THE INVENTION

The present invention discloses a method and apparatus for post-processing to provide reliability information for decoded data symbols at the output of a decoder that avoids many of the disadvantages of prior methods. The invention utilizes a suboptimal implementation of the optimal symbol-by-symbol detection (OSSD) method. Instead of taking all possible paths at each time instant into account as done in the OSSD, only one decoded path (which is the maximum likelihood path for an inner Viterbi decoder) and a finite number of error paths are computed. Hence, both the amount of computation and storage may be small compared to present techniques.

The method and apparatus is first used for an inner decoder that is based on the Viterbi algorithm. The method advantageously determines the probabilities of a list of likely alternatives that differ from the decoded sequence at least in the symbol for which the reliability information is being computed and uses the most probable of these as a basis for computing the reliability. The method and associated apparatus potentially have a smaller complexity than those using previously proposed soft output Viterbi algorithms because, unlike in previous techniques the reliability information is computed for all states at each time instant, the reliability information is evaluated only for the ML sequence. Second, the method and associated apparatus advantageously recognize that the functions of likelihood evaluation and decision, which are inherently combined in the VA, could instead be separated. This implies that the post-processor is applicable to any (suboptimal hard-output) detector in applications with a given likelihood function. Finally, the techniques may be generalized for an arbitrary coder.

BRIEF DESCRIPTION OF THE DRAWINGS

Other features and advantages of the invention will become apparent from the following detailed description taken together with the drawings in which.

DETAILED DESCRIPTION

I. Introduction

Figure 3:
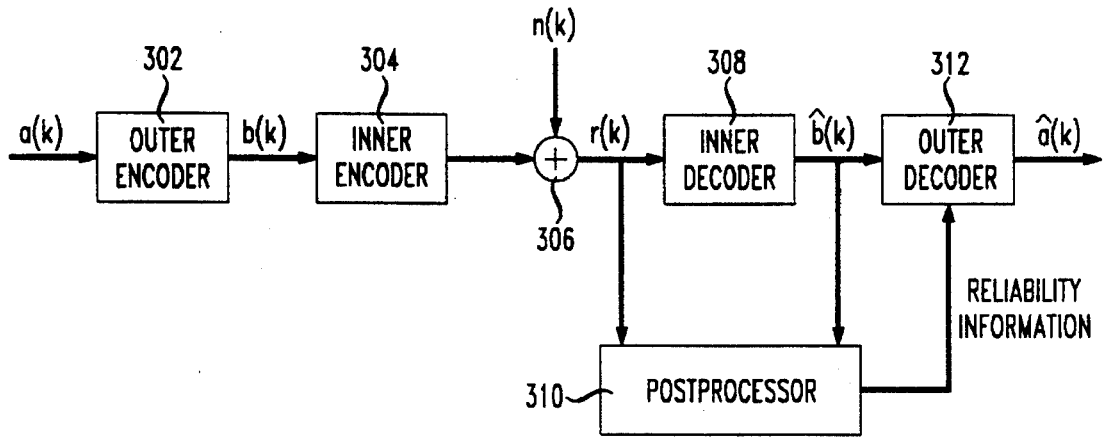
FIG. 3 illustrates a concatenated coding system with a post-processor.

FIG. 3 illustrates an embodiment of the invention in which post-processor 310 is used in a concatenated coding system. Post-processor 310 accepts the received sequence r(k) and the output b(k) of inner decoder 308 and generates a signal representing reliability information for use by outer decoder 312 in determining â(k). The principles of the invention may be described as follows instead of constructing an optimal detector which combines likelihood evaluation and decision making by the VA, both of these functions can be separated. In many applications, it is too expensive to optimize the likelihood function (e.g., if the number of states is excessive). But a suboptimum (hard decision) decoder/detector is often implementable. Also the likelihood function for the given problem is assumed to be known. The hard decisions of the arbitrary decoder/detector are fed into a likelihood function evaluator. To obtain reliability information for a particular decoded bit, that bit alone is flipped, and the likelihood is evaluated. The ratio of the likelihoods is then the reliability associated with this information bit. More generally, rather than flipping a single information bit alone, we may choose to flip some of the other bits too (e.g. neighboring bits) to compute the reliability of that bit.

Section II describes the proposed method in detail. Section III presents illustrative embodiments of the method in different applications indicative of the broad spectrum of possible applications.

II. A Method for Post-Processor Reliability Generation

Figure 4:
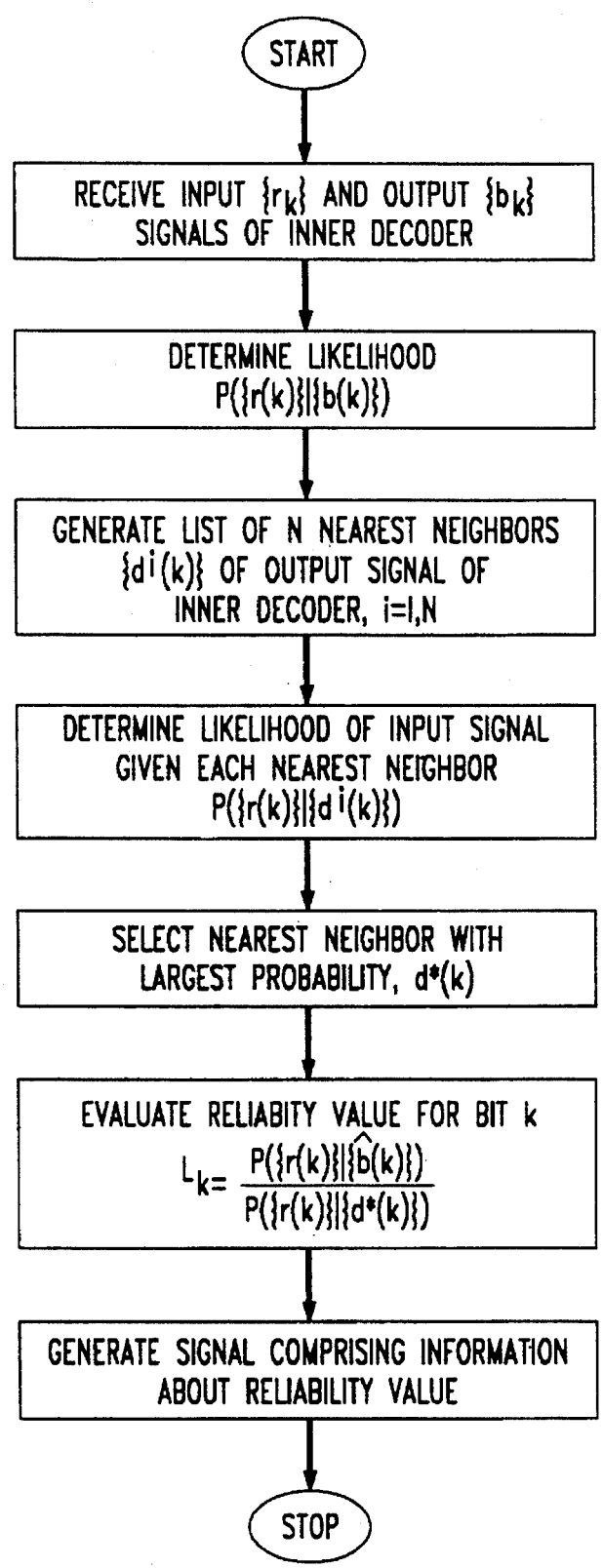
FIG. 4 illustrates the operation of a post-processor.

FIG. 4 illustrates the steps performed by post-processor 310 to generate signals containing reliability information for use by outer decoder 312. Assume a communications system with binary signaling and alphabet ±1. Although binary signaling is assumed, generalization to more than two levels is straightforward. The MAP (maximum a posteriori) detector at time k computes the likelihood or conditional probability $$P(b_k=j|\{r_k\})$$

Here $\{r_k\}$ is the received sequence and j takes on values ±1. The detected symbol is the value with the higher probability and is denoted $\hat{b}_k$. It is assumed that this probability can be computed. See L. R. Bahl, J. Cooke, F. Jelinek and J. Raviv, "Optimal Decoding of Linear Codes for Minimizing Symbol Error Probability," *IEEE Trans. Inf. Theory*, vol. IT-20, ;pp. 284–287, March 1974. The reliability associated with symbol $\hat{b}_k$ is $$L_k = \frac{P(\hat{b}_k|\{r_k\})}{1 - P(\hat{b}_k|\{r_k\})}$$

Since the complexity of this method is high, simplified or suboptimal approaches are desired.

Figure 1:
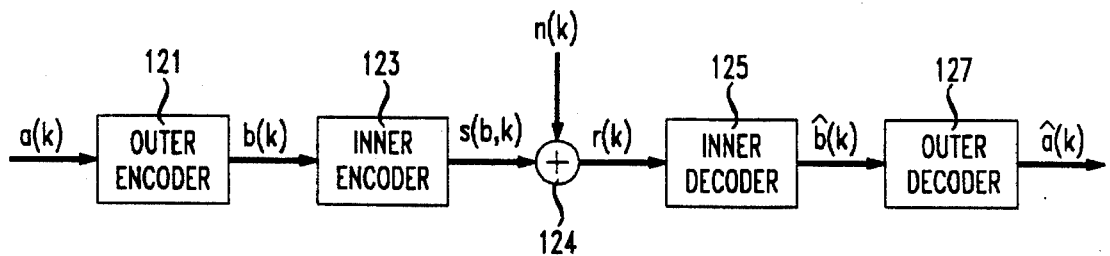
FIG. 1 illustrates a concatenated coding system.
Figure 2:
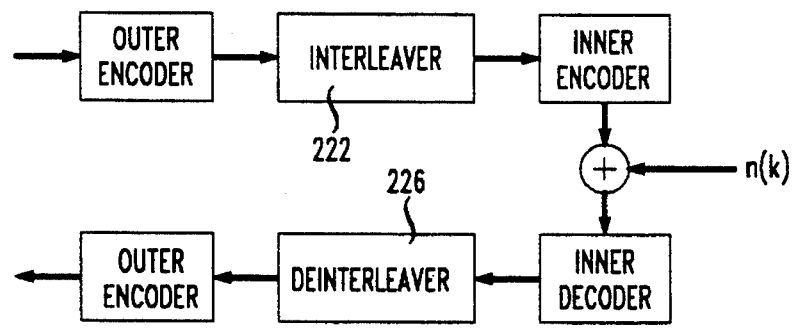
FIG. 2 illustrates a concatenated coding system with interleaving and deinterleaving.

An alternative representation that is amenable to simplification is as follows. Let the output of the outer code of FIG. 1 be the data sequence $\{b(k)\}$, which is encoded by the inner code to produce the transmitted data sequence $\{s(b,k)\}$, where k is the time index. The received sequence $\{r(k)\}$ is $\{s(b,k)\}$ corrupted by the noise sequence $\{n(k)\}$. The noise random variate $n_k$ is assumed to be an i.i.d. (independent, identically distributed.) zero mean Gaussian variate with probability density function given by $$p_n(n_k) = \frac{1}{\sigma\sqrt{2\pi}} e^{-n_k^2/2\sigma^2}.$$

where $\sigma^2$ is the variance of the Gaussian variate. Then the conditional likelihood of the received sequence conditioned on $\{b(k)\}$ is $$p(\{r(k)\}|\{b(k)\}) = \pi_k \, p_n[r(k) - s(b,i)].$$

Let $S_+(k)$ be the set of all sequences of $\{b(k)\}$ for which the data estimate at time k is +1, and let $S_-(k)$ be the set of all sequences of $\{b(k)\}$ for which the data estimate at time k is −1. Let the corresponding sequence probabilities be $P(b_+)$ and $P(b_-)$, respectively. Then, the likelihood function of the OSSD under the hypothesis of a +1 was transfitted is given by $$L(k) = K \cdot \log \frac{\Sigma_{S_+(k)} P(b_+)}{\Sigma_{S_-(k)} P(b_-)},$$

where K is an arbitrary positive constant which is the same for all bits. OSSD decision requires the computation of all path probabilities. This may be done recursively and requires block-processing, estimating of the noise variance $\sigma^2$, and avoidance of numerical problems. See J. Hagenauer, P. Hoeher, and J. Huber, supra.

A first step towards simplification of OSSD is as follows: let the maximum likelihood estimate of the data sequence, which can be found efficiently by the Viterbi algorithm, be denoted by $$\{\hat{b}(k)\} = \arg\max_{\{b(k)\}} p(\{r(k)\}|\{b(k)\}),$$

(where arg max denotes the argument, i.e. that data sequence, which minimizes the probability) and let the conditional probability associated with the ML decoded data sequence be $P(\hat{b})$. Consider a sequence $\{d(k)\}$ that differs from $\{\hat{b}(k)\}$ in bit position k. In the presence of additive white Gaussian noise, this probability is given by $p(\{r(k)\}|\{d(k)\})$. Among all such sequences $\{d(k)\}$, only the one with the highest probability is chosen. Let this sequence be $\{d^*(k)\}$ and let the associated a posteriori probability be $P(d^*)$. Then, the likelihood function reduces to $$L^*(k) = K \cdot \log \frac{P(\hat{b})}{P(d^*)} \geq 0.$$

This task of generating an alternative hypothesis for the decoded symbol is done at each time instant, and the reliability for that symbol is evaluated. However, the list of alternatives to be considered grows exponentially in the length of the data sequence $\{b(k)\}$. A second simplification is to consider only the nearest neighbor alternatives or the nearest neighbors and the neighbors at the next smallest distance, etc. The number of nearest neighbors and the exact sequence structure can be derived one the inner encoding process is specified. Let there be N nearest neighbors. For each neighboring sequence d(k) we compute the a a posteriori probability P (d) and choose the one with the largest probability. This probability now approximates P (d*). Obviously the larger the number of alternatives, the better is the quality of the soft information at the cost of increase in computational complexity. Note that the performance of the OSSD cannot be approached as long as only one path is considered in the numerator (because of the prior decision) and in the denominator, respectively. However, the generalization is straightforward by taking multiple paths into account and applying the high-SNR rule. See J. Hagenauer, P. Hoeher, and J. Huber, supra.

In some applications, especially in time-varying situations, the distance properties of the inner code are not given a-priori, such as for time-varying ISI channels. It could be too time-consuming to compute this distance property. Then, a further simplification is to consider the $2^{2D}$ alternatives that differ only within a finite window from instant k–D to k+D. Let the output of an arbitrary inner decoder be $\hat{b}(\hat{k})$. Let the associated a posteriori probability be $P(\hat{b})$. For each alternative sequence d(k), determine the a posteriori probability $$P(\{r(k)\}|\{d(k)\})$$

and choose the largest one. Let it be d*(k) and let the associated a posteriori probability be P(d*). The likelihood at time k, i.e. the reliability value of the $k^{th}$ bit is $$L_k = \frac{P(\hat{b})}{P(d^*)}$$

As an example, let us assume that the single information bit is the most likely error, and if D=0, the error table consists of only one entry, namely that sequence which differs from the decoded sequence at time k and is the same everywhere else.

III. Applications

Overview

Examples A and B consider concatenated coding systems consisting of an outer parity check code and an inner code, which is a binary intersymbol interference channel with a memory of two channel symbols and a memory two rate R=½ convolutional code, respectively. The first stage of the inner decoder is a Viterbi decoder with four states for both examples. Without reliability information from the inner decoder, the outer decoder can only perform error detection. In the presence of reliability information, however, Wagner decoding can be performed to obtain a 1–2 dB gain for the two examples. The third example considers a coded synchronous DS-CDMA system with a zero-forcing multiuser detector ("decorrelation detector"). A combined likelihxperimentsood evaluation and decision, e.g. by means of the (SO)VA, is not applicable for K=32 users. Therefore, the outputs of the decorrelation detector are post-processed which can be implemented with linear effort in K.

Example A

Inner ISI Channel and Outer Parity Check Code

Consider the example of an outer code consisting of a single parity bit added to 8 information bits. The output of the outer code is interleaved and antipodally transmitted as +1 or −1 over an ISI channel. The ISI channel impulse response is h(0)=0.26, h(1)=0.93, and h(2)=0.26. The noisy received data is decoded by a 4-state Viterbi decoder performing maximum likelihood sequence estimation. As described in J. G. Proakis, Digital Communications, McGraw-Hill, 2nd ed., 1989. Reliability information is generated by considering error sequences which result in the smallest and the next to smallest Euclidean distances. There are 4 such error patterns. These are $$\{e^{(1)}\} = 0, 0, \ldots, 0, \quad e(0) = 2, \quad 0, \ldots$$
$$\{e^{(2)}\} = 0, 0, \ldots, 0, \quad e(0) = 2, \quad e(1) = -2, 0, \ldots$$
$$\{e^{(3)}\} = 0, 0, \ldots, 0, \quad e(0) = 2, \quad e(1) = -2, e(2) = 2, 0, \ldots$$
$$\{e^{(4)}\} = 0, 0, \ldots, 0, \quad e(0) = 2, \quad e(1) = -2, e(2) = 2, e(3) = -2, 0, \ldots$$
(1)

A zero in the error vector indicates no error, while a 2 indicates that $+1$ is decoded as $-1$. Similarly $-2$ indicates that $-1$ is decoded as $+1$.

The error patterns should be added or subtracted from the decoded sequence depending on the sign of the decoded data symbol for which the reliability is being computed. Without loss of generality let it be $a^*(k)$. If the sign of the decoded symbol is negative (positive), then the error sequence should be added (subtracted) to the decoded data sequence. Also, the error pattern is listed in such a way that the error symbol $e(0)$ should be added to or subtracted from $a^*(k)$, $e(1)$ to $a^*(k+1)$, etc. Further, a valid error pattern for consideration is the one which when added or subtracted yields a legitimate alternative information sequence. For example if the decoded data symbols in a window centered around $a^*(k)$ are all $-1$, then the only error sequence from the short list in (1), that yields a legitimate alternative information sequence is $\{e^{(1)}\}$. In general, two types of error events should be considered. The first one is where the error event starts at time k. The second one is where the error event started at an earlier instant and has not terminated at time k and furthermore an error occurs at time k. Only the former requires new probability evaluations, since the probabilities corresponding to the latter situation would have been evaluated before.

After deinterleaving both the decoded sequence and the corresponding soft information sequence, the parity is computed every 9 bits. If the parity is incorrect, then the bit with the least reliability is flipped.

Example B

Inner Convolutional Code and Outer Parity Check Code

This example considers a rate $R=11/12$ parity check outer code and a rate $R=\frac{1}{2}$ inner convolutional code. The overall rate of the concatenated code is $R=11/24$. The convolutional code has memory $M=2$ with free distance $d_{free}=5$. The total number of incorrect neighbors at distance d is denoted $a_d$. $a_1=a_2=a_3=a_4=0$, $a_5=1$, $a_6=2$, $a_7=4$, etc. For each neighbor at a distance d, there are $c_d$ information bits in error. $c_1=c_2=c_3=c_4=c_5=1$, $c_6=4$, $c_7=12$, etc. The soft outputs were produced with an error table consisting of error patterns with Hamming weight $d=5, 6,$ and 7. At any given time k, seven $(a_5+a_6+a_7=7)$ new alternatives need to be evaluated. (This is the number of list elements actually to be stored.) However, in order to account also for error events starting at earlier instants, one needs to consider all seventeen $(c_5+c_6+c_7=17)$ alternatives.

Parameter in this figure is the number of alternatives in the error table. When the list size is $c_5=1$, only the Hamming distance 5 event is considered. When the list size is $c_5+c_6=5$, all events up to distance 6 are considered, and when the list size is $C_5+c_6+c_7=17$, all events up to distance 7 are considered.

Example C

Coded DS-CDMA System with ZF Multiuser Detector and Likelihood Post-Processor

This last example demonstrates that the post-processor is not only applicable to obtain reliability information in combination with a Viterbi decoder, but can be more generally used to obtain reliability information given hard decisions of any (including suboptimum) decoder/detector, if a likelihood function can be formulated for this problem. This also leads to a new class of suboptimum decoder/detectors.

The particular example considers coded synchronous DS-CDMA system. The optimum multiuser detector delivering symbol reliability information is an OSSD; see S. Verdu, "Minimum Probability of Error for Asynchronous Gaussian Multiple-Access Channels," IEEE Trans. Inform. Theory, vol. IT-32, pp. 85–96, Jan. 1986. The complexity of this detector, however, increases exponentially in the number of users, K, and hence is impractical even for moderate K. The zero-forcing (ZF) multiuser detector ("decorrelation detector") belongs to the class of linear multiuser detectors, with a complexity which is only linear in K. This detector is easily to implement when the signature sequence is known. However, since this detector inverts the channel (analog to a zero-forcing equalizer inverting an ISI channel), the outputs do not contain valuable reliability information, e.g. large amplitudes do not necessarily represent reliable decisions. Therefore, this embodiment illustrates a post-processor following the zero-forcing multiuser detector or any other multiuser detector.

The basic method to obtain reliability information from any (hard decision) detector for a problem with a given likelihood function is to substitute hard decisions into the likelihood function, and to flip successively only a single information bit given the remaining decisions are fixed. This method can easily be extended by flipping all permutations with two information bits, three information bits, etc., or to evaluate the most likely error events. Thus, in the limit the optimum detector is approached.

Consider a coded synchronous DS-CDMA system with $K=32$ active users. The signature sequences are fixed consecutive chunks of length $N=64$ of a $2^{22}-1$ PN sequence. The encoder is a rate $\frac{1}{2}$ convolutional code with memory $M=2$, i.e. four states, and the corresponding decoder is a soft-decision Viterbi decoder with 32 symbols delay. The encoded bits are spread by a $(B, M)=(64, 24)$ convolutional interleaver to (almost completely) randomize error bursts in the receiver. The transmission format is binary antipodal signaling. Each user is transmitting over a Rayleigh fading channel with a normalized Doppler frequency of 0.01. These channels are mutually independent, and are assumed to be perfectly tracked by the receiver.

Finally, a class of new suboptimum decoder/detectors, e.g. multiuser detectors, can be designed. The idea is to run any decoder/detector with a following post-decision unit, to select the, let say k, least reliable bit decisions, and to run finally an optimum (post) decoder/detector for only these k information bits given the remaining decisions to be fixed. Hence, the complexity of the post decoder is only exponential in k instead of in K.

We claim:

1. A method for generating a signal comprising reliability information for a given symbol in a first signal in a decoding system wherein said decoding system comprises a first decoder, wherein said first decoder decodes a received signal to generate said first signal, said method comprising the steps of:

determining the likelihood of the received signal given the first signal, said received signal having been received over a communications channel corrupted by noise;

selecting a set of L nearest neighbors to said first signal wherein each nearest neighbor differs from said first signal in the given symbol;

determining a set of L likelihoods each representing the likelihood of the received signal given a respective nearest neighbor in the selected set of nearest neighbors;

selecting the nearest neighbor with the greatest likelihood;

generating a signal representing a reliability value for the given symbol in said first signal wherein said reliability value is a function of said received signal, said first signal and said selected nearest neighbor.

2. The method of claim 1 wherein said first signal is a maximum likelihood sequence estimate generated by a Viterbi decoder.

3. The method of claim 1 wherein said signal representing said reliability value is input to a second decoder.

4. The method of claim 1 wherein said set of L nearest neighbors is generated from knowledge of a code, said code having distance properties, and from the distance properties of said code wherein said code was used to encode said received signal.

5. The method of claim 1 wherein said set of L nearest neighbors is generated by selecting an alternative set of symbol values for symbols within a window around said given bit.

6. The method of claim 1 wherein said first decoder is a suboptimal decoder and further comprising the steps of:

selecting a set of k symbols in said first signal;

determining the likelihood of each second signal in a set of second signals wherein each second signal is formed by substituting for said set of k symbols in said first signal an alternative set of k symbols; and replacing said first signal by the second signal having maximum likelihood.

* * * * *